United States Patent
Kwon et al.

(10) Patent No.: US 11,155,206 B2
(45) Date of Patent: Oct. 26, 2021

(54) PROXIMITY SENSOR

(71) Applicants: Hyundai Motor Company, Seoul (KR); Kia Motors Corporation, Seoul (KR)

(72) Inventors: Gideok Kwon, Seoul (KR); Seok Jun Oh, Seoul (KR); Moo Yong Kim, Gyeonggi-do (KR); Donghee Seok, Gyeonggi-Do (KR); Jong Bok Lee, Gyeonggi-do (KR); HeeJin Ro, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 267 days.

(21) Appl. No.: 16/175,070

(22) Filed: Oct. 30, 2018

(65) Prior Publication Data
US 2019/0152391 A1    May 23, 2019

(30) Foreign Application Priority Data
Nov. 20, 2017  (KR) ................. 10-2017-0154416

(51) Int. Cl.
| | | |
|---|---|---|
| *B60Q 9/00* | (2006.01) | |
| *H03K 17/955* | (2006.01) | |
| *G06F 3/044* | (2006.01) | |
| *G06F 3/041* | (2006.01) | |
| *H03K 17/96* | (2006.01) | |

(52) U.S. Cl.
CPC ............. *B60Q 9/007* (2013.01); *G06F 3/044* (2013.01); *G06F 3/0416* (2013.01); *H03K 17/955* (2013.01); *H03K 17/962* (2013.01); *H03K 2217/960705* (2013.01); *H03K 2217/960755* (2013.01)

(58) Field of Classification Search
CPC ......... B60Q 9/007; G06F 3/046; G06F 3/044; G06F 3/0448; G06F 3/0416; G06F 3/04164; G06F 2203/04107; H03K 17/955; H03K 17/945; H03K 2017/9455; H03K 2217/960755; H03K 2217/960705; H03K 2217/960765
See application file for complete search history.

(56) References Cited

U.S. PATENT DOCUMENTS

2011/0057669 A1* 3/2011 Xu ........................... G06F 3/044
                                                                    324/658
2013/0001058 A1* 1/2013 Bowler ................ H03K 17/962
                                                                    200/600

(Continued)

*Primary Examiner* — Huy Q Phan
*Assistant Examiner* — Dustin R Dickinson
(74) *Attorney, Agent, or Firm* — Mintz Levin Cohn Ferris Glovsky and Popeo, P.C.; Peter F. Corless

(57) ABSTRACT

A proximity sensor installed inside a vehicle can include: an outer frame formed of a first non-conductive substance and including a first metal layer; an inner frame formed of a second non-conductive substance, including a second metal layer, and disposed in an interior of the outer frame; a sensor electrode contacting the second metal layer; and a sensor Integrated Circuit (IC) connected to the sensor electrode and configured to detect an approach or a contact of a user's hand. The first metal layer can be connected to the ground (GND) so as to confine a sensing field of the sensor electrode to the interior of the outer frame.

9 Claims, 17 Drawing Sheets

(56) References Cited

U.S. PATENT DOCUMENTS

2013/0170013 A1* 7/2013 Tonar .................. G02F 1/157
                                                                                  359/296
2014/0177176 A1* 6/2014 Torii ................... H05K 1/0259
                                                                                  361/748
2017/0017335 A1* 1/2017 Takahashi ............ G06F 3/0446

* cited by examiner

PROXIMITY SENSOR

CROSS-REFERENCE TO RELATED APPLICATION

This application claims the benefit of priority under 35 U.S.C. § 119 to Korean Patent Application No. 10-2017-0154416, filed on Nov. 20, 2017 in the Korean Intellectual Property Office, the disclosure of which is incorporated herein by reference in its entirety.

BACKGROUND

1. Technical Field

The present disclosure relates to a proximity sensor for vehicle, and more particularly, to a capacitive proximity sensor.

2. Discussion of Related Art

A proximity sensor is a device for detecting an approaching object. The proximity sensor can be used in various fields. For example, the proximity sensor may be installed in an input device of a vehicle to control audio, video, navigation, air conditioning for detecting whether the user's finger is approaching thereto, and the like.

An exemplary input device, in which a proximity sensor is installed, has been provided in the interior of a vehicle with an exterior formed with a metallic substance. However, in a case of infrared proximity sensors, which is commonly installed in vehicles, when a non-transmissive substance such as metal is placed in front of the sensor, infrared rays cannot pass the substance. Therefore, functionality of the infrared proximity sensor deteriorates. Furthermore, the volume of an infrared sensor module is typically relatively large, and thus extra space for installing the module is required.

In some vehicles, capacitive proximity sensors have been installed instead of infrared proximity sensors. In this case, however, a sensing field created by the capacitive proximity sensor has no directivity, so the sensing area may be larger than intended by the designer. As a result, sensing is performed in unwanted areas, which increases noise-making frequency. Furthermore, when the user gets inside the vehicle, the user's body parts, such as knees, may come into contact with the proximity sensor, further interrupting the sensor's operation.

SUMMARY OF THE DISCLOSURE

The present disclosure provides a proximity sensor with a metallic exterior to provide an improved aesthetic feeling.

The present disclosure also provides a proximity sensor with an easily manufactured design and simple structure.

The present disclosure also provides a proximity sensor with efficient space utilization because it requires no extra installation space.

The present disclosure also provides a proximity sensor with improved substance selection and degree of freedom for design.

The present disclosure also provides a proximity sensor with reduced noise-making frequency by revising its sensing area.

In accordance with embodiments of the present disclosure, a proximity sensor installed inside the vehicle can include: an outer frame formed of a first non-conductive substance and including a first metal layer; an inner frame formed of a second non-conductive substance, including a second metal layer, and disposed in an interior of the outer frame; a sensor electrode contacting the second metal layer; and a sensor Integrated Circuit (IC) connected to the sensor electrode and configured to detect an approach or a contact of a user's hand, wherein the first metal layer is connected to the ground (GND) so as to confine a sensing field of the sensor electrode to the interior of the outer frame.

The proximity sensor may further include a printed circuit board (PCB) having the sensor IC mounted thereon and including a ground layer forming the ground (GND).

The proximity sensor may further include a connector connecting the first metal layer to the ground (GND).

The outer frame may include a metal complex, and the connector may be formed by metalizing an electrode recess formed by irradiating laser to the outer frame.

The connector may include at least one of a wire, a flexible PCB, and a conductive tool.

The outer frame may include a closed loop forming a range of a sensing field of the sensor electrode.

The inner frame may divide the closed loop of the outer frame into at least two portions.

The inner frame may include a first inner frame, a second inner frame, and a third inner frame, which are separated from one another, a metal layer of the first inner frame may be connected to the sensor electrode and the sensor IC, and metal layers of the second and third inner frames, respectively, may not be connected to the sensor electrode and the sensor IC.

The proximity sensor may further include non-conductive ribs disposed between the first and second inner frames and between the first and third inner frames.

The inner frame may include a metal complex, and the sensor electrode may be formed by metalizing an electrode recess formed by irradiating laser to the inner frame.

Furthermore, in accordance with embodiments of the present disclosure, a proximity sensor installed inside the vehicle can include: an outer frame formed of a first non-conductive substance; an inner frame formed of a second non-conductive substance and disposed in an interior the outer frame; a first metal layer covering an outer surface of the outer frame; a second metal layer covering an outer surface of the inner frame; a sensor electrode separated from the second metal layer by a predefined distance; and a sensor Integrated Circuit (IC) connected to the sensor electrode so as to detect an approach or a contact of a user's hand, wherein the first metal layer is connected to the ground (GND) so as to confine a sensing field of the sensor electrode to the interior of the outer frame.

The proximity sensor may further include a printed circuit board (PCB) having the sensor IC mounted thereon and including a ground layer forming the ground (GND).

The outer frame may include a closed loop forming a range of a sensing field of the sensor electrode.

The inner frame may divide the closed loop of the outer frame into at least two portions.

The proximity sensor may further include a panel coupled with the inner frame and receiving the PCB.

The panel may include a metal complex, and the sensor electrode may be formed by metalizing an electrode recess formed by irradiating laser to the panel.

The proximity sensor may further include a sensor electrode base including the sensor electrode and coupled to the panel.

The sensor electrode base may include a metal complex, and the sensor electrode may be formed by metalizing an electrode recess formed by irradiating laser to the sensor electrode base.

The inner frame may include a first inner frame, a second inner frame, and a third inner frame, which are separated from one another, a metal layer of the first inner frame may be connected to the sensor electrode and the sensor IC, and metal layers of the second and third inner frames may not be connected to the sensor electrode and the sensor IC.

The proximity sensor may further include non-conductive ribs disposed between the first and second inner frames and between the first and third inner frames.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

Figure 1:
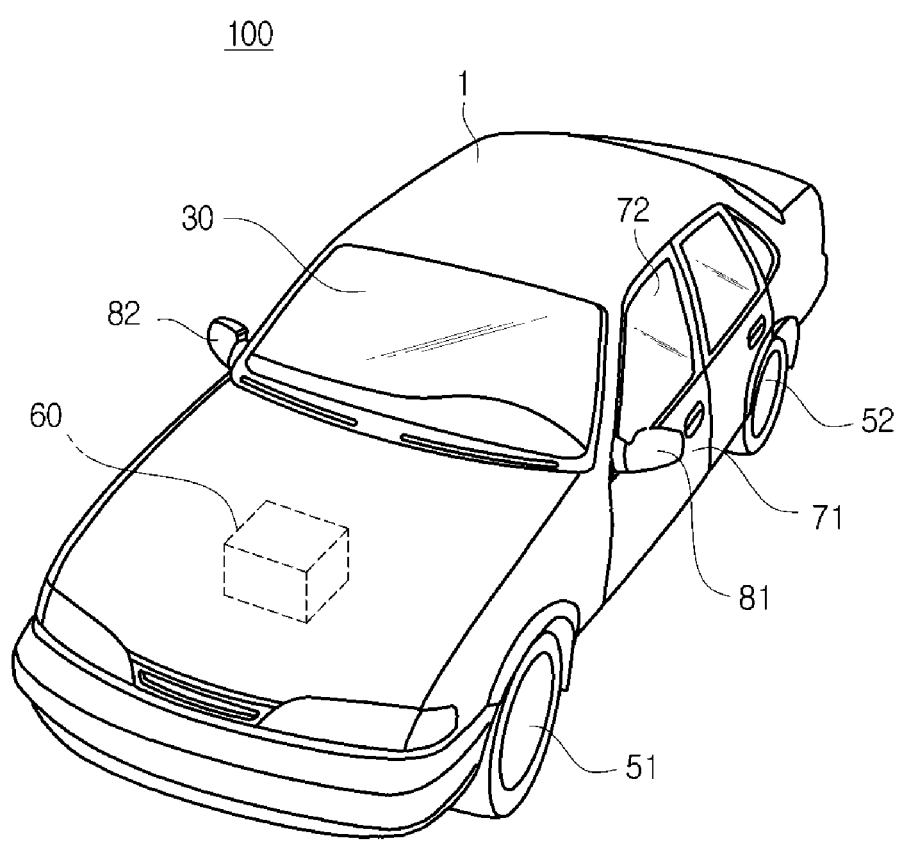
FIG. 1 shows the exterior of a vehicle, according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF EXEMPLARY EMBODIMENTS

Reference will now be made in detail to embodiments, examples of which are illustrated in the accompanying drawings, wherein like reference numerals refer to the like elements throughout. As those skilled in the art would realize, the described embodiments may be modified in various different ways, all without departing from the spirit or scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. The controller may control operation of units, modules, parts, or the like, as described herein. Moreover, it is understood that the below methods may be executed by an apparatus comprising the controller in conjunction with one or more other components, as would be appreciated by a person of ordinary skill in the art.

Furthermore, the controller of the present disclosure may be embodied as non-transitory computer readable media containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed throughout a computer network so that the program instructions are stored and executed in a distributed fashion, e.g., by a telematics server or a Controller Area Network (CAN).

Referring now to the presently disclosed embodiments, FIG. 1 shows the exterior of a vehicle, according to embodiments of the present disclosure.

As shown in FIG. 1, the vehicle 100 may include a main body 1 that constitutes the exterior of the vehicle 100, a front glass 30 that allows the driver inside the vehicle 100 to look ahead of the vehicle 100, wheels 51, 52 for moving the vehicle 100, a driving system 60 for turning the wheels 51, 52, doors 71 that shield the inside of the vehicle 100 from outside, and side mirrors 81, 82 that help the driver see areas behind and to the sides of the vehicle 100.

The front glass 30, also termed as a windshield glass, is placed on the top front of the main body 100 for the driver inside the vehicle 100 to obtain visual information about things in front of the vehicle 100.

The wheels 51 and 52 include front wheels 51 and rear wheels 52, and the driving system 60 may provide turning forces to the front wheels 51 or rear wheels 52 to move the vehicle 100 forward or backward. The driving system 60 may employ a motor that produces the turning force from electrical power supplied from a storage battery (not shown) or a combustion engine (not shown) that burns a fuel to create the turning force.

The doors 71 may be pivotally attached onto the left and right sides of the main body 1, and opened for the driver and passenger to get on or get off the vehicle 100 and closed for shielding the inside of the vehicle 100 from outside. The doors 71 may have windows 72 installed thereon for the driver and passenger to look in or out through the windows 72. In some embodiments, the windows 72 may be installed to have only one viewable side and be opened and closed.

The side mirrors 81 and 82 include a left side mirror 81 and a right side mirror 82 placed on the left and right sides of the main body 1, respectively, for helping the driver obtain views behind and to the side of the vehicle 100.

It is understood that the exterior of the vehicle 100 as described above and illustrated in FIG. 1 is provided merely for demonstration purposes, and does not limit the scope of the present disclosure.

Figure 2:
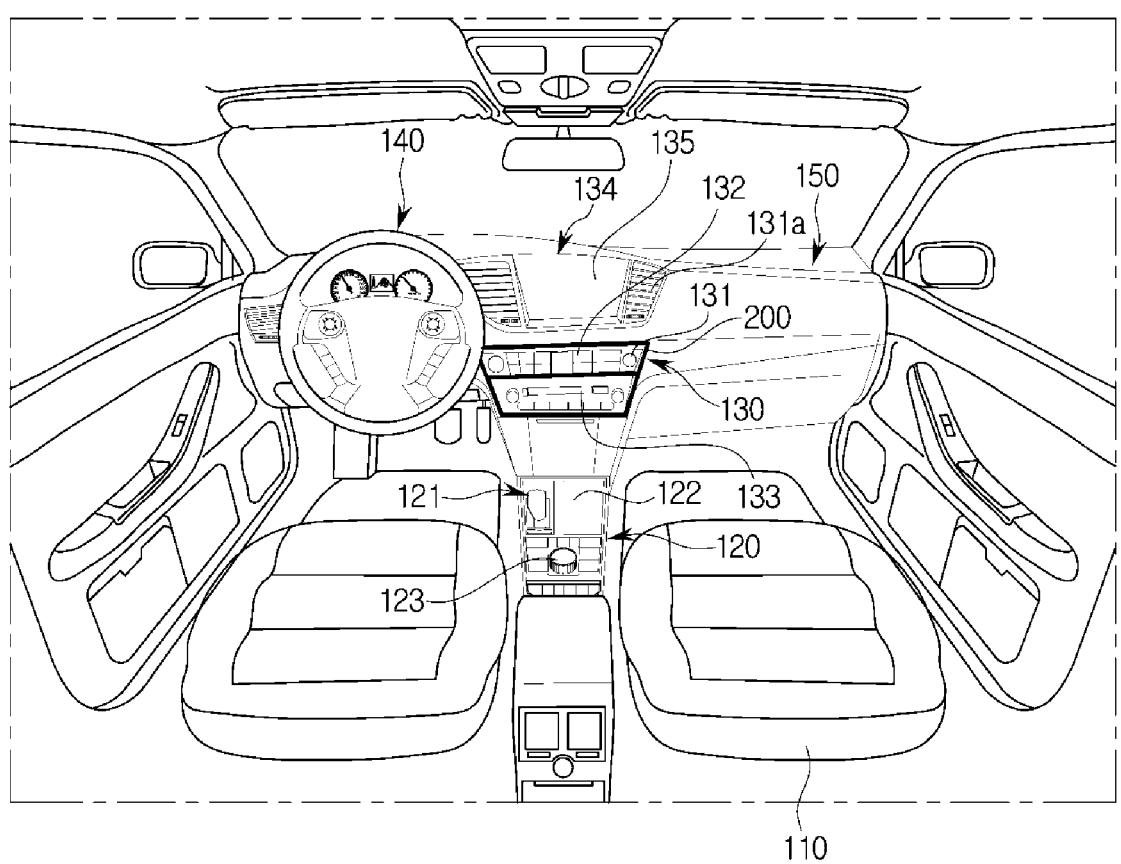
FIG. 2 shows the interior of a vehicle, according to embodiments of the present disclosure.

FIG. 2 shows the interior of a vehicle, according to embodiments of the present disclosure.

As shown in FIG. 2, the vehicle 100 may include seats 110 reserved for driver and passengers to sit on, a gear box 120, a center fascia 130 and a dashboard 150 having a steering wheel 140.

In the gear box 120, a gearshift 121 for shifting gears of the vehicle 100, and a touch pad 122 for controlling functions of the vehicle 100 may be installed. A dial adjuster 123 may be optionally installed as needed.

In the center fascia 130, an air conditioner 131, a clock 132, an audio system 133, and an Audio, Video, and Navigation (AVN) system 134 may be installed.

The air conditioner 131 keeps the atmosphere inside the vehicle 100 pleasant by controlling temperature, humidity, air cleanness, and air flows inside the vehicle 100. The air conditioner 131 may include at least one vent 131a installed in the center fascia 130 for venting air. There may also be buttons or dials installed in the center fascia 130 to control e.g., the air conditioner 131. The driver or the user may control the air conditioner 131 with the buttons arranged on the center fascia 130.

The clock 132 may be arranged around the buttons or dials for controlling the air conditioner 131.

The audio system 133 may include a control panel on which a number of buttons are mounted to perform functionality of the audio system 133. The audio system 133 may provide a radio mode for radio listening and a media mode for reproducing audio files stored in various storage media.

The AVN system 134 may be embedded in the center fascia 130 of the vehicle 100. The AVN system 134 is a system for comprehensively performing audio, video and navigation functions of the vehicle 100 according to the user's manipulation. The AVN system 134 may include a display 135 for receiving user commands regarding the AVN system 134 and displaying a screen related to audio play, video play, or navigation.

The center fascia 130 may also include a proximity sensor 200 provided to recognize an input means such as the user's hand or a touch pen approaching or making a contact. The proximity sensor 200 may recognize whether the user is approaching and touching thereto based on a change in capacity from the approach and touch of the user.

It is understood that the interior of the vehicle 100 as described above and illustrated in FIG. 2 is provided merely for demonstration purposes, and does not limit the scope of the present disclosure.

Figure 3:
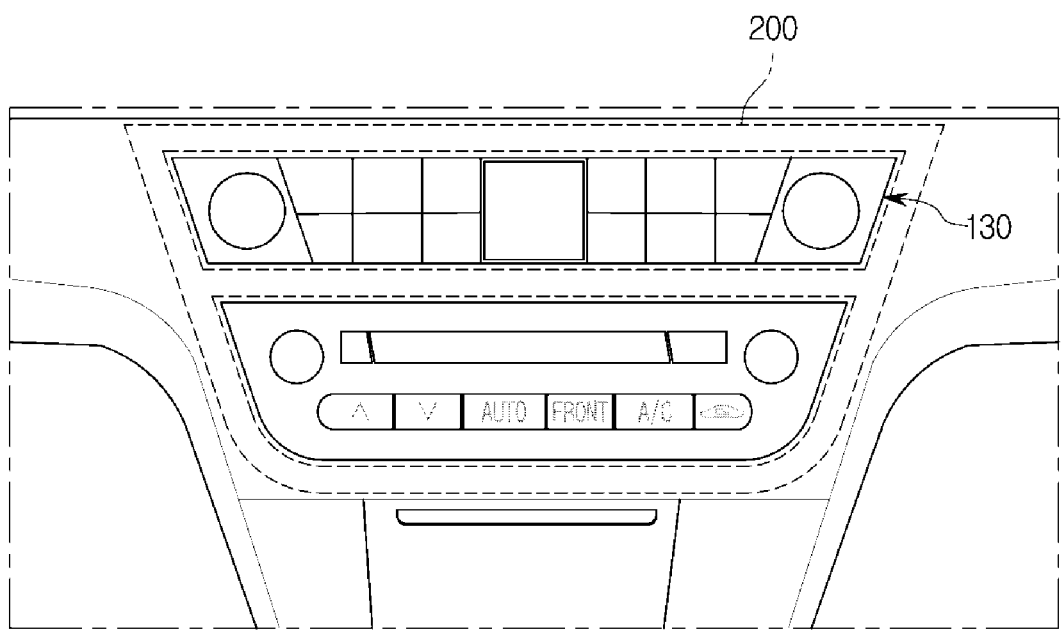
FIG. 3 shows a center fascia of a vehicle with a proximity sensor installed therein, which is in a state before the user approaches thereto, according to embodiments of the present disclosure.
Figure 4:
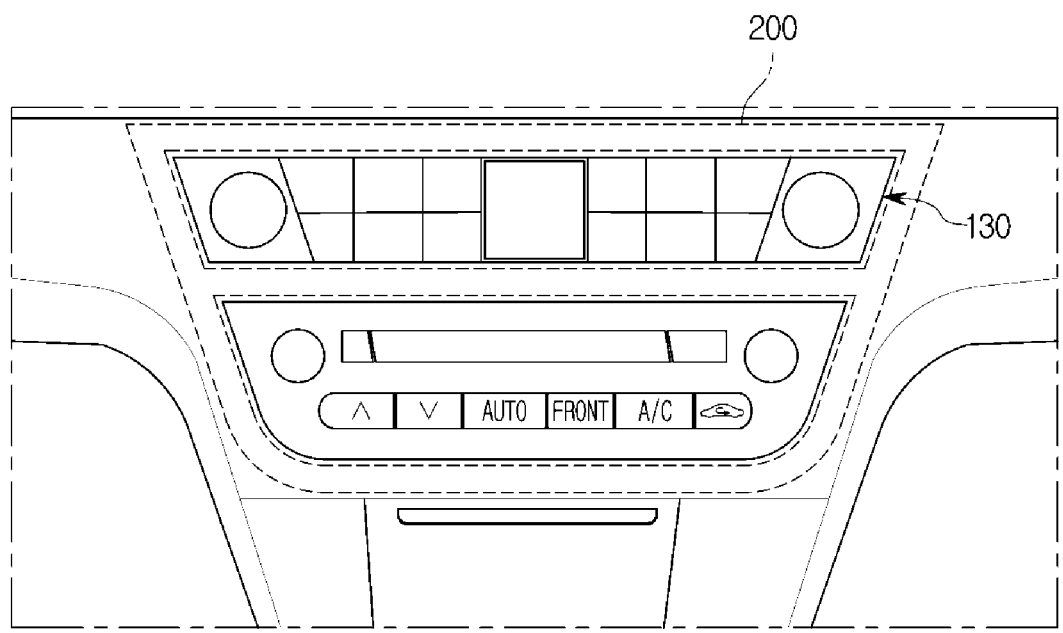
FIG. 4 shows the proximity sensor shown in FIG. 3 in a state that the user approaches thereto.

FIG. 3 shows a center fascia of a vehicle with a proximity sensor installed therein, which is in a state before the user approaches thereto, according to embodiments of the present disclosure. FIG. 4 shows the proximity sensor shown in FIG. 3 in a state that the user approaches thereto.

The proximity sensor 200 may be connected to a controller (not shown). The controller may control the air conditioner 131, the audio system 133, and the AVN system 134. The proximity sensor 200 may recognize whether a user approaches thereto and send the related signal to the controller. The controller may control brightness of a light emitting unit (not shown) provided in the buttons, dials, and display of the air conditioner 131, the audio system 133, the AVN system 134 based on the received signal.

For example, as shown in FIG. 3, the brightness of the light emitting unit provided in the buttons or dials on the center fascia remains low until a user approaches. This is to get rid of light pollution due to excessive indoor lighting during nighttime driving. During night time driving, too much indoor lighting unintended by the user may distract the user, which could lead to an accident. Accordingly, unintended power to the light emitting unit provided in the buttons on the center fascia may be blocked or the brightness level may be reduced to prevent disturbance of driving by the light.

When the user approaches or touches the proximity sensor 200, as shown in FIG. 4, brightness of the light emitting unit provided in the button on the center fascia 130 may increase. This may enable the user to easily check the position or state of each button. In this way, if the user has an intention, this mechanism would not disturb driving from the light pollution even if the brightness of the light emitting unit increases but rather be helpful for driving because it makes it easy to locate the button. Furthermore, as the current state of a function may be indicated just by the approach of the user, high-tech image and classiness of the interior may be emphasized.

In embodiments of the present disclosure, the exterior of the proximity sensor 200 may be made of a metallic substance.

There is a growing preference for metallic substances for the interior of vehicles. It is because the luxurious image given by metal is preferred by people. Although there was an attempt to use a metallic substance for exposed portions of the proximity sensor, a problem with the use arose because when it comes to the conventional infrared sensor placed behind a non-transmissive material like metal, infrared rays may not pass the material nor reach the sensor.

The proximity sensor 200 in accordance with embodiments of the present disclosure has no problem with the use of non-transmissive metal because it includes a capacitive proximity sensor Integrated Circuit (IC).

Structures of the proximity sensor in accordance with various embodiments of the present disclosure will now be described in detail.

Figure 5:
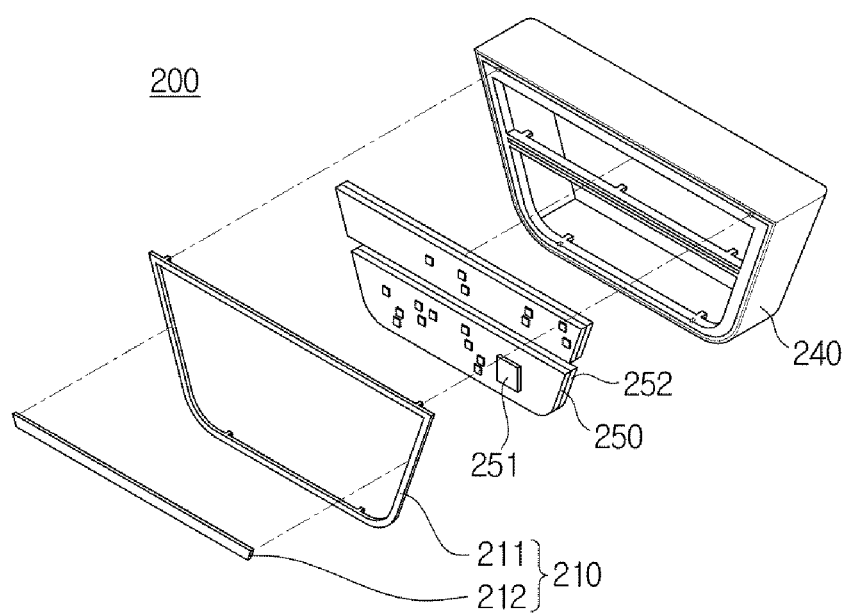
FIG. 5 is an exploded view of a proximity sensor, according to embodiments of the present disclosure.

FIG. 5 is an exploded view of a proximity sensor, according to an embodiments of the present disclosure.

As shown in FIG. 5, the proximity sensor 200 may include a frame 210 arranged to be exposed to the outside of the center fascia 130, a panel 240 coupled with the rear side of the frame 210 to support the frame 210, a printed circuit board (PCB) 250 received inside the panel 240, and a sensor IC 251 mounted on the PCB 250.

Although not shown in detail, the outer surface of the frame 210 may be provided with a metal layer 220. Furthermore, there may be a sensor electrode 230 connected to the sensor IC 251. The sensor electrode 230 may be connected to the PCB 250 and accordingly, to the sensor IC 251.

The frame 210 may be made of a non-conductive substance. For example, the frame 210 may be made of plastics and manufactured by injection molding. There are no limitations on the shape of the frame 210. For example, a portion of the frame 210 may have a curved form and the frame 210 may include a bending portion.

In embodiments of the present disclosure, the frame 210 may include a bezel forming an outer boundary of the various buttons or display on the center fascia 130. If the sensor IC may be able to detect approach of a user to the bezel, the sensor IC may recognize that the user is approaching to touch the buttons or touch parts arranged within the bezel. That is, when the proximity sensor is provided near the bezel, it may recognize the approach of the user to a button even if there is no extra proximity sensor provided for the button. However, as will be described later, the sensing area of the proximity sensor needs to be properly adjusted to prevent recognition of an unintended approach of a user.

The frame 210 may include an outer frame 211 and an inner frame 212. The outer frame may be formed of a first non-conductive substance. The inner frame may be formed of a second non-conductive substance. The first non-conductive substance and the second non-conductive substance may be the same material.

The outer frame 211 may have the form of a closed loop. It is not, however, limited thereto, but may have the form of an open ring.

The inner frame 212 may be disposed in an interior of the outer frame 211. The inner frame 212 may divide the interior of the outer frame 211, which has the form of a closed loop, into two or more. Although the inner frame has the form of a straight line in FIG. 5, it is merely by way of example and the inner frame may have a curved form or may have changing thickness. In other words, there are no limitations on the form of the inner frame.

The frame 210 may be exposed to the outside of the center fascia 130. To meet the recent needs of users for metallic substances, the frame 210 may be made of a metallic substance.

If the entire frame 210 is manufactured of the metallic substance, it may weigh heavy and increase costs, causing an increase of manufacturing costs.

Accordingly, the frame 210 is formed of plastics by e.g., injection molding as before, and after that, the outer surface of the frame 210 may be formed of a metallic substance by metal coating or Ion Plasma Evaporation (IPE). For example, the outer surface of the frame 210 may be chromed.

In this way, the metal layer 220 including the metallic substance may be formed on the outer surface of the frame 210, which is exposed to the outside of the center fascia 130. As the outer surface of the frame 210 is formed of the metallic substance, classiness and beauty of the interior of the vehicle may be improved.

Figure 6:
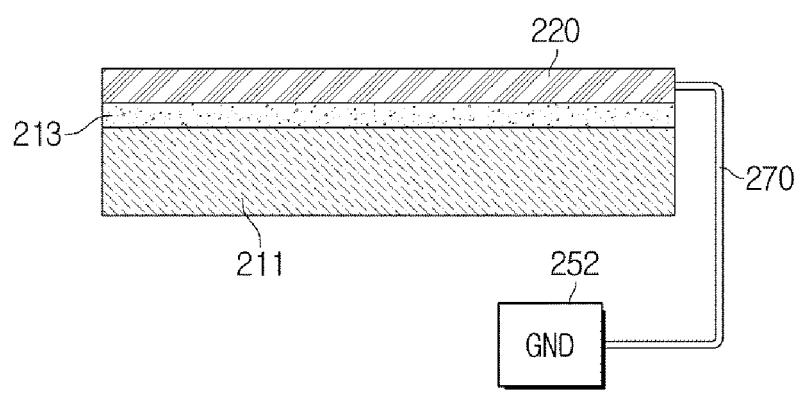
FIG. 6 is a conceptual diagram illustrating a cross-section of an outer frame of the proximity sensor of FIG. 5, according to embodiments of the present disclosure.
Figure 7:
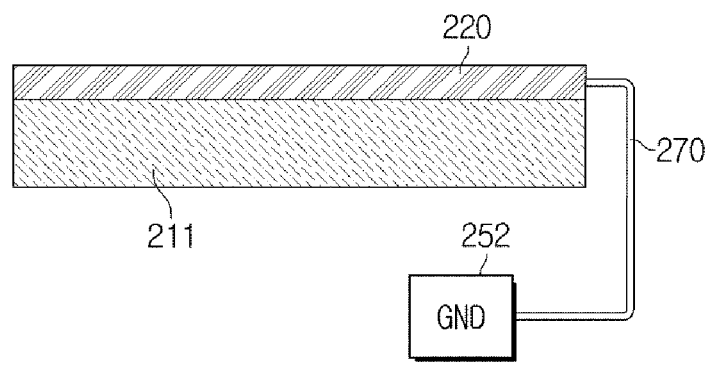
FIG. 7 is an additional conceptual diagram illustrating a cross-section of an outer frame of the proximity sensor of FIG. 5, according to embodiments of the present disclosure.

FIG. 6 is a conceptual diagram illustrating a cross-section of an outer frame of the proximity sensor of FIG. 5, according to embodiments of the present disclosure, and FIG. 7 is an additional conceptual diagram illustrating a cross-section of an outer frame of the proximity sensor of FIG. 5, according to embodiments of the present disclosure.

In the following description, for convenience of explanation, the metal layer 220 arranged on the outer surface of the outer frame 211 is called a first metal layer, and the metal layer 220 arranged on the inner frame 212 is called a second metal layer.

As shown in FIG. 6, the first metal layer 220 may be formed on the outer surface of the outer frame 211. To enhance adhesion between the first metal layer 220 and the outer frame 211, a primer layer 213 may be provided. The primer layer 213 may be arranged between the first metal layer 220 and the outer frame 211.

However, it is possible to omit the primer layer 213. Referring to FIG. 7, the metal layer 220 may be arranged right on the outer frame 211 without the primer layer.

The first metal layer 220 may be connected to the ground GND. The ground may be variously provided. For example, the ground GND may be formed on a ground layer 252 arranged on the PCB 250 (see FIG. 5). Alternatively, although not shown, the ground GND may be formed at a chassis ground of the vehicle. The PCB 250 may be connected to the chassis ground of the vehicle. In the following description, an occasion when the ground layer 252 of the PCB 250 corresponds to the ground GND will be focused.

The proximity sensor 200 may include a connector 270 connecting the first metal layer 220 and the ground GND 252.

The connector 270 may be variously provided as a configuration to electrically connect the first metal layer 220 and the ground GND 252. For example, the connector may be provided as a wire, a PCB, a flexible PCB, an injection molded product including a metal complex, and an injection molded product including an electrode by a Laser Directing Structure (LDS) method. Furthermore, the method for forming the connector may include any widely known method for electrically connecting two objects, such as metal vapor deposition or a method of extending a substance for plating to the ground GND from the first metal layer, a method of extending a substance including a conductive material to the ground GND from the first metal layer, or the like.

When the first metal layer 220 is connected to the ground GND 252, the sensing field of the proximity sensor 200 may be confined to the inside of the first metal layer 220. With this structure, the proximity sensor 200 in an embodiment of the present disclosure may not recognize an unintended approach of a user. That is, it may get rid of noise. Furthermore, it may prevent damage to the sensor IC due to static electricity. This will be described in more detail later.

FIGS. 8 to 11 are conceptual diagrams illustrating a cross-section of an inner frame of the proximity sensor of FIG. 5, according to embodiments of the present disclosure.

Figure 8:
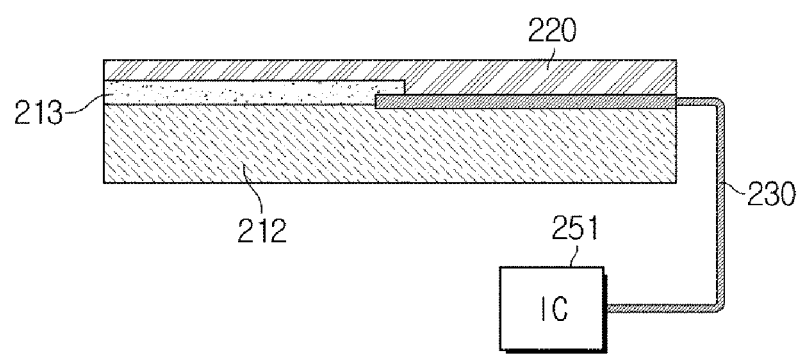
FIG. 8 is a conceptual diagram illustrating a cross-section of an inner frame of the proximity sensor of FIG. 5, according to embodiments of the present disclosure.

As shown in FIG. 8, a sensor electrode 230 may be formed on a side of the inner frame 212. The sensor electrode 230 may be formed using an LDS method. The LDS method refers to a method of forming a conductive structure in a region of a supporter member exposed to laser by forming the supporter member with a material including a non-conductive and chemically stable metal complex, exposing a metal seed by exposing a portion of the supporting member to laser, such as Ultra Violet (UV) laser or Excimer laser to break chemical bonding of the metal complex, and metalizing the supporting member.

The inner frame 212 may be made of a substance including a metal complex. An electrode recess (not shown) may be formed on the frame 210 by exposing the frame 210 to laser, and the electrode recess is metalized to form the sensor electrode 230.

The sensor electrode 230 may be arranged in some area of the outer surface of the inner frame 212. The area of the outer surface of the inner frame 212 where the sensor electrode 230 is arranged may be very small as compared to the entire area of the outer surface of the inner frame 212.

The primer layer 213 may be formed on the other portion of the outer surface of the inner frame 212 than the portion where the sensor electrode 230 is arranged. The primer layer 213 is an element to stably couple the second metal layer 220 and the inner frame 212, serving as a kind of adhesive. The primer layer 213 may be arranged on the inner frame 212 before the second metal layer 220 is formed. The primer layer 213 may be formed across a wider area than the area across which the sensor electrode 230 is arranged on the inner frame 212.

Although a portion of the primer layer 213 covers a portion of the sensor electrode 230 in FIG. 8, it is not limited thereto. The primer layer 213 and the sensor electrode 230 may not overlap each other in some other embodiments.

The primer layer 213 may be arranged in a partial area of the outer surface of the inner frame 212. A metal plating area or metal vapor deposition area across which the second metal layer 220 is formed may be larger than the primer area across which the primer layer 213 is formed.

The second metal layer 220 may cover the primer layer 213 and the sensor electrode 230. Since the sensor electrode 230 and the second metal layer 220 have a structure of making a physical contact with each other, the sensor electrode 230 and the second metal layer 220 of a conductive metallic substance are electrically connected. Accordingly, the sensor IC 230 may detect the user approaching or contacting not only the sensor electrode 230 but also the second metal layer 220 electrically connected to the sensor electrode 230. Accordingly, the second metal layer 220 may serve as a sensing part.

The sensor electrode 230 formed on the inner frame 212 may be connected to the PCB 250, and accordingly, to the sensor IC 251 mounted on the PCB 250.

The sensor electrode 230 may be connected to the PCB 250 in various ways. Although not shown, the proximity sensor 200 may include a flexible PCB that connects the sensor electrode 230 formed on the inner frame 212 and the PCB 250.

As shown in FIG. 7, the sensor electrode 230 may be formed on the outer surface of the inner frame 212, and the second metal layer 220 may be arranged right on the sensor electrode 230 without the primer layer. In this case, although adhesion between the second metal layer 220 and the sensor electrode 230 or the inner frame 212 may be relatively weak without the primer layer, productivity may be improved because the process of forming the primer layer can be omitted.

As shown in FIG. 8, the primer layer 213 may be arranged on the sensor electrode 230, and the second metal layer 220 may be arranged on the primer layer 213. In this case, with the primer layer 213, the second metal layer 220 may be stably coupled with the inner frame 212 or the sensor electrode 230. Since the primer layer 213 is very thin, the second metal layer 220 may serve as a sensing part even if the second metal layer 220 and the sensor electrode 230 are not in physical contact with each other. However, as compared with an occasion when the second metal layer 220 physically contacts the sensor electrode 230, its sensitivity may be reduced.

Figure 9:
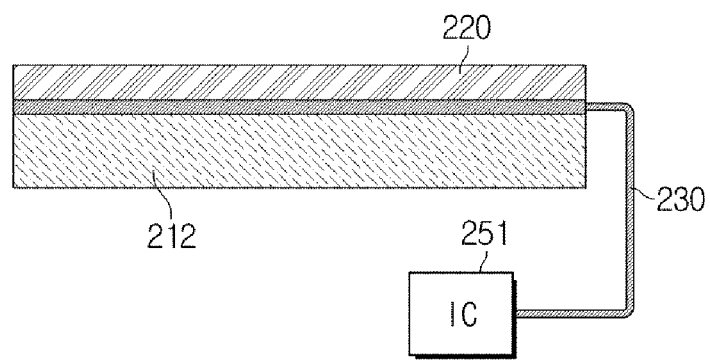
FIG. 9 is an additional conceptual diagram illustrating a cross-section of an inner frame of the proximity sensor of FIG. 5, according to embodiments of the present disclosure.
Figure 10:
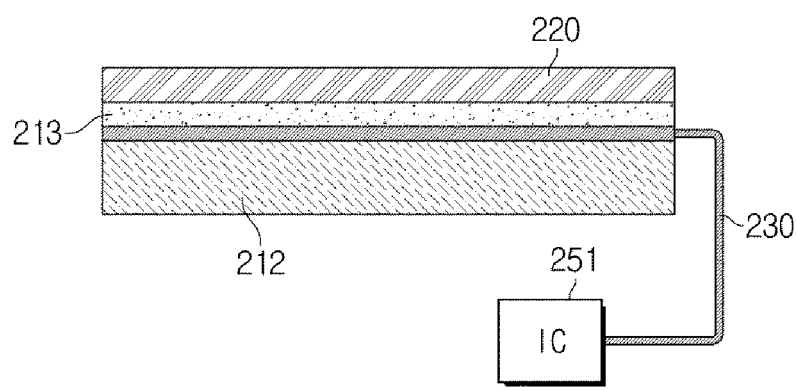
FIG. 10 is an additional conceptual diagram illustrating a cross-section of an inner frame of the proximity sensor of FIG. 5, according to embodiments of the present disclosure.
Figure 11:
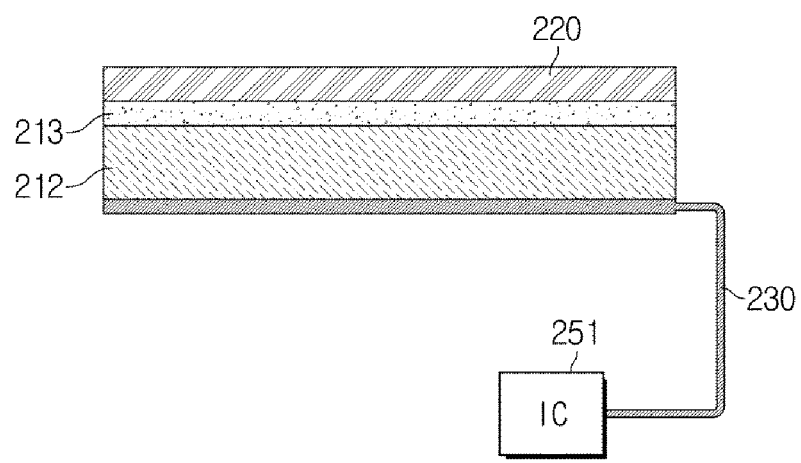
FIG. 11 is an additional conceptual diagram illustrating a cross-section of an inner frame of the proximity sensor of FIG. 5, according to embodiments of the present disclosure.

FIG. 9 is an additional conceptual diagram illustrating a cross-section of an inner frame of the proximity sensor of FIG. 5, according to embodiments of the present disclosure.

As shown in FIG. 9, the second metal layer 220 may be arranged on the outer surface of the inner frame 212, and the sensor electrode 230 may be arranged between the second metal layer 220 and the inner frame 212. The second metal layer 220 may be arranged on one side of the inner frame 212, and the sensor electrode 230 may be arranged on between the second metal layer 220 and the inner frame 212.

The sensor electrode 230 may be connected to the PCB 250 in various ways as in FIGS. 6 to 8.

The sensor electrode 230 may be formed on the inner frame 212 by the LDS method. The sensor electrode 230 and the second metal layer 220 may be separated by the thickness of the inner frame 212. Since the thickness of the inner frame 212 is fixed, capacitance created between the second metal layer 220 and the sensor electrode 230 is constant. On the other hand, capacitance created between the user and the second metal layer 220 may change by the distance between the user and the second metal layer 220. Accordingly, with the change in distance between the second metal layer 220 and the user, the capacitance of the sensor electrode 230 changes. The sensor IC 251 may detect the change in capacitance of the sensor electrode 230. The sensor IC 251 may even detect a small change in capacitance of the sensor electrode 230 and recognize whether the user approaches or touches the second metal layer 220 based on the change in capacitance.

Figure 12:
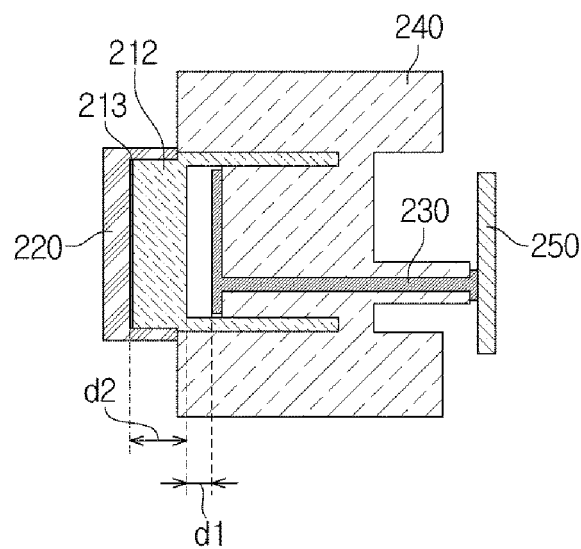
FIG. 12 is a conceptual diagram illustrating a cross-section of the proximity sensor shown in FIG. 5.

FIG. 12 is a conceptual diagram illustrating a cross-section of the proximity sensor shown in FIG. 5.

As shown in FIG. 12, the sensor electrode 230 may be formed on a side of a panel 240. Specifically, the sensor electrode 230 may be formed on a side of the panel 240 facing the inner frame 212. The sensor electrode 230 may be formed using the LDS method. For this, the panel 240 may be formed of a substance including a metal complex.

The sensor electrode 230 may be arranged to be separated from the second metal layer 220 by a certain distance. As shown in FIG. 12, the inner frame 212 and the sensor electrode 230 is separated by d1, and assuming that the thickness of the inner frame 212 is d2, the sensor electrode 230 and the second metal layer 220 may be separated by d1+d2. Since the thickness d2 of the inner frame 212 and the distance d1 between the sensor electrode 230 and the inner frame 212 are fixed, d1+d2 is fixed. Accordingly, capacitance created between the second metal layer 220 and the sensor electrode 230 is constant. On the other hand, capacitance created between the user and the second metal layer 220 may change by the distance between the user and the second metal layer 220. Accordingly, with the change in distance between the second metal layer 220 and the user, the capacitance of the sensor electrode 230 changes. The sensor IC 251 may detect the change in capacitance of the sensor electrode 230. The sensor IC 251 may even detect a small change in capacitance of the sensor electrode 230 and recognize whether the user approaches or touches the second metal layer 220 based on the change in capacitance.

In the meantime, an air layer may be formed in the empty space between the sensor electrode 230 and the inner frame 212. With the air layer formed between the sensor electrode 230 and the inner frame 212, even if a high voltage takes place instantaneously across the second metal layer 220 due to e.g., static electricity, the high voltage has little chance of being transferred to the sensor electrode 230 and the sensor IC 251. Accordingly, the possibility for the sensor IC 251 to be damaged by the static electricity is very low. In other words, durability or stability of the sensor IC 251 may be improved.

Figure 13:
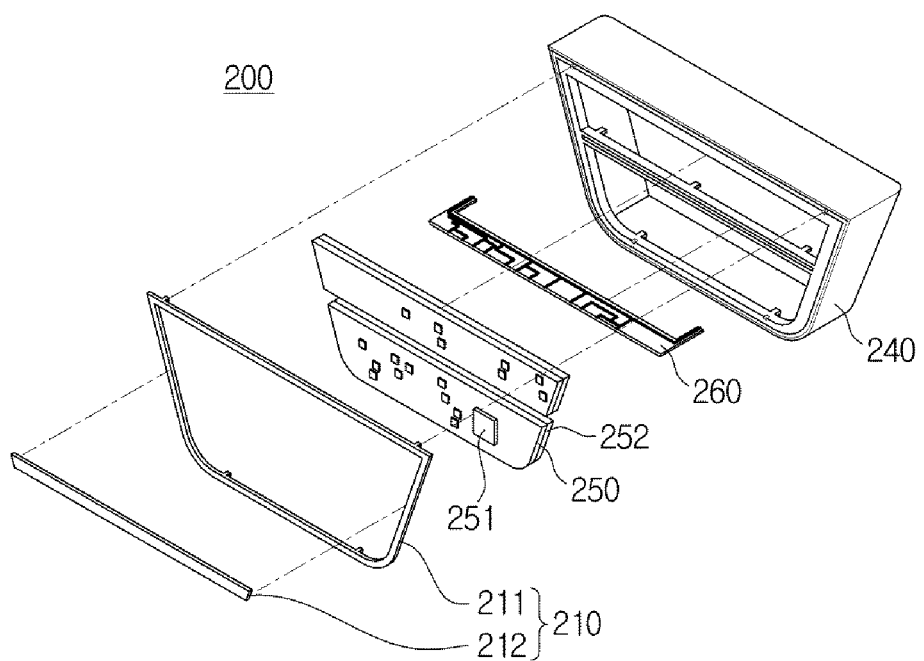
FIG. 13 is an additional exploded view of a proximity sensor, according to embodiments of the present disclosure.
Figure 14:
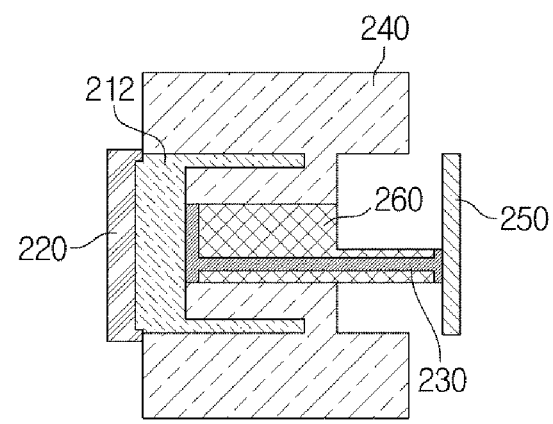
FIG. 14 is a conceptual diagram illustrating a cross-section of the proximity sensor shown in FIG. 13.

FIG. 13 is an additional exploded view of a proximity sensor, according to embodiments of the present disclosure, and FIG. 14 is a conceptual diagram illustrating a cross-section of the proximity sensor shown in FIG. 13.

The frame 210 may include an outer frame 211 and an inner frame 212. The frame 210 was already described above, so the overlapping description thereof will not be repeated below.

As shown in FIG. 13, in embodiments of the present disclosure, the proximity sensor 200 may include the frame 210, the metal layer 220 formed on the outer surface of the frame 210, the panel 240 coupled with the frame 210, a sensor electrode base 260 having the sensor electrode 230 and coupled with the panel 240, the PCB 250 received inside the panel 240, and the sensor IC 251 mounted on the PCB 250.

In this example, the proximity sensor 200 may include the sensor electrode base 260 provided separately from the panel 240 and coupled with the panel 240.

The sensor electrode base 260 may include the sensor electrode 230. The sensor electrode base 260 may be coupled with the panel 240 to connect the sensor electrode 230 to the PCB 250.

The sensor electrode 230 formed on the sensor electrode base 260 may be formed using the LDS method. For this, the sensor electrode base 260 may be formed of a substance including a metal complex.

Referring to FIG. 14, the sensor electrode base 260 may be arranged to come into contact with the rear side of the inner frame 212 when coupled with the panel 240. At this time, the sensor electrode 230 may come into contact with the rear side of the inner frame 212. The second metal layer 220 may be formed on the front side of the inner frame 212 by metal plating or metal vapor deposition, and the second metal layer 220 may be formed after a primer layer (not shown) is formed on the front side of the inner frame 212. As described above, it is preferable to have the primer layer for stable coupling of the second metal layer 220 and the inner frame 212, but the primer layer may be omitted in some embodiments.

The sensor electrode 230 and the second metal layer 220 may be separated by the thickness of the inner frame 212. Since the thickness of the inner frame 212 is fixed, capacitance created between the second metal layer 220 and the sensor electrode 230 is constant. On the other hand, capacitance created between the user and the second metal layer 220 may change by the distance between the user and the second metal layer 220. Accordingly, with the change in distance between the second metal layer 220 and the user, the capacitance of the sensor electrode 230 changes. The sensor IC 251 may detect the change in capacitance of the sensor electrode 230. The sensor IC 251 may even detect a small change in capacitance of the sensor electrode 230 and recognize whether the user approaches or touches the second metal layer 220 based on the change in capacitance.

In the meantime, although not shown, even with the sensor electrode base 260 provided, an air layer may be formed between the sensor electrode 230 and the rear side of the inner frame 212. As described above, when the air layer is formed, a possibility for the sensor IC 251 to be damaged becomes low, so the durability of the sensor IC 251 may be improved.

If the sensor electrode base 260 is provided separately from the panel 240, the manufacturing costs may be saved and the productivity may be improved.

It is easier to form the sensor electrode on the sensor electrode base 260 with simple structure and easy to fix, than to form the sensor electrode on the relatively complicated panel 240 by laser irradiation after having the panel 240 fixed. In other words, instead of the panel having large volume and difficult to be processed for forming the sensor electrode, the sensor electrode base having small volume and easy to be processed may be used to form the sensor electrode thereon, so the productivity of the proximity sensor may be improved. The sensor electrode base 260 may be easily coupled with the panel 240 by e.g., fitting.

To form the sensor electrode on the panel 240 with relatively large volume in the LDS method, the entire panel 240 needs to be formed of a substance including a metal complex. On the other hand, since the sensor electrode base 260 has smaller volume than the panel 240, an increase in the manufacturing costs is less than using the panel 240. Furthermore, the sensor electrode base 260 may be used in common with various forms of panels and accordingly, mass-produced, thereby saving the production cost.

Figure 15:
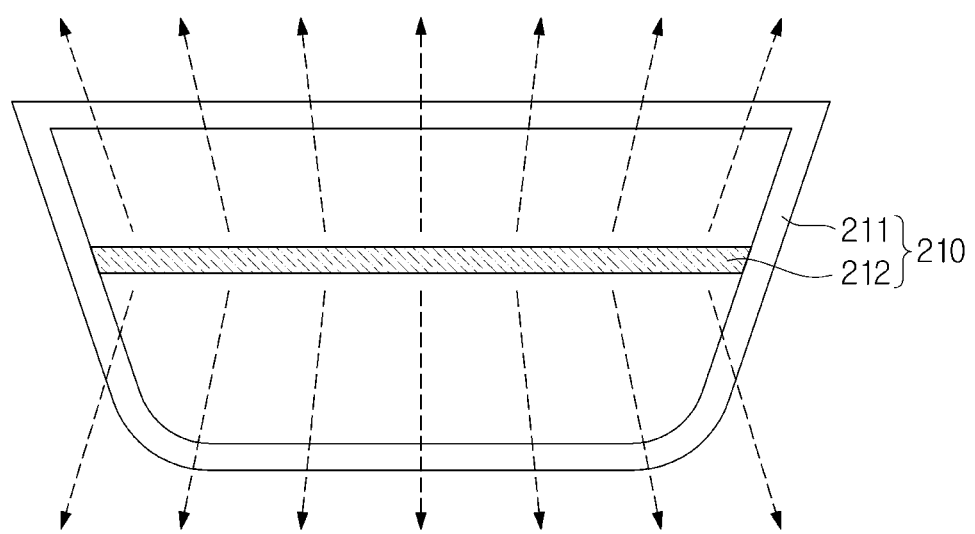
FIG. 15 is a conceptual diagram illustrating a sensing area of the proximity sensor when the outer frame is not connected to the ground (GND), according to embodiments of the present disclosure.
Figure 16:
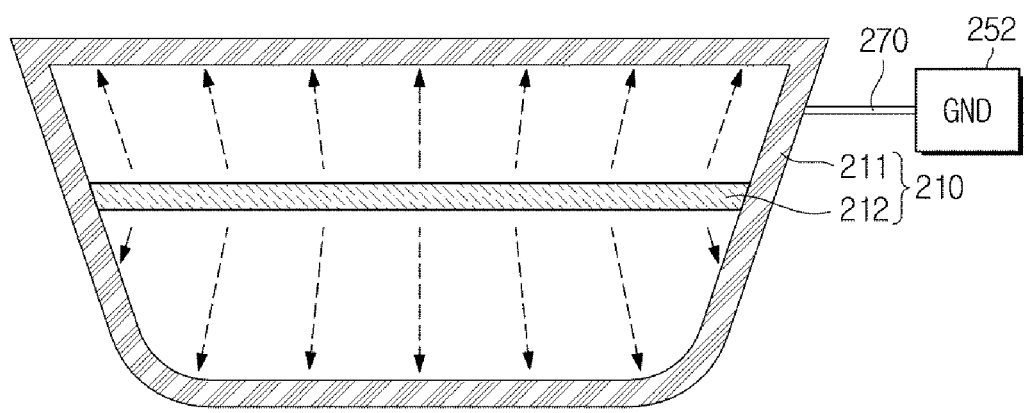
FIG. 16 is a conceptual diagram illustrating a sensing area of the proximity sensor when the outer frame is connected to the ground (GND), according to embodiments of the present disclosure.

FIG. 15 is a conceptual diagram illustrating a sensing area of the proximity sensor when the outer frame is not connected to the ground (GND), according to embodiments of the present disclosure, and FIG. 16 is a conceptual diagram illustrating a sensing area of the proximity sensor when the outer frame is connected to the ground (GND), according to embodiments of the present disclosure.

The sensing area of the proximity sensor in accordance with embodiments of the present disclosure will now be described in detail in connection with FIGS. 15 and 16.

As shown in FIG. 15, the second metal layer of the inner frame 212 may serve as a sensing part. The sensing area of the second metal layer is formed in all directions. Therefore, the sensing area may be formed in upward, downward, left, right, and rear directions in addition to the forward direction of the second metal layer. Some of the directions are intended by the designer, but the others may not be intended by the designer to recognize approach of the user, causing wrong recognition or noise.

The outer frame 211 may serve as a bezel to form an outer boundary of the button portion. If the user approaches to touch the button portion, the user's finger may come within the boundary of the outer frame 211 that forms a closed loop. That is, the outer frame 211 may be a reference to set a range of the sensing area. For example, even if the user's finger approaches outside of the outer frame 211, it is not the approach to touch the button portion, so the recognition of this by the proximity sensor 200 corresponds to recognition of noise. Accordingly, this noise needs to be eliminated.

FIG. 16 shows the proximity sensor 200 with the sensing field confined to the interior the outer frame 211 to eliminate noise. For this, the first metal layer of the outer frame 211 is connected to the ground GND. The connector 270 may be variously provided as described above. If there is the ground GND, an electric field vector that forms the sensing field converges to the ground GND, so the sensing field is confined to the interior of the outer frame 211. In other words, the outer frame 211 connected to the ground GND may shield the sensing field within the outer frame 211.

In the meantime, when the outer frame 211 is connected to the ground GND, even if static electricity is generated on the surface of the proximity sensor 200, the static electricity is bypassed to the ground GND through the outer frame 211, thereby reducing shocks from the static electricity transferred to various devices on the PCB. That is, durability may be improved by reducing the shocks from the static electricity.

Figure 17:
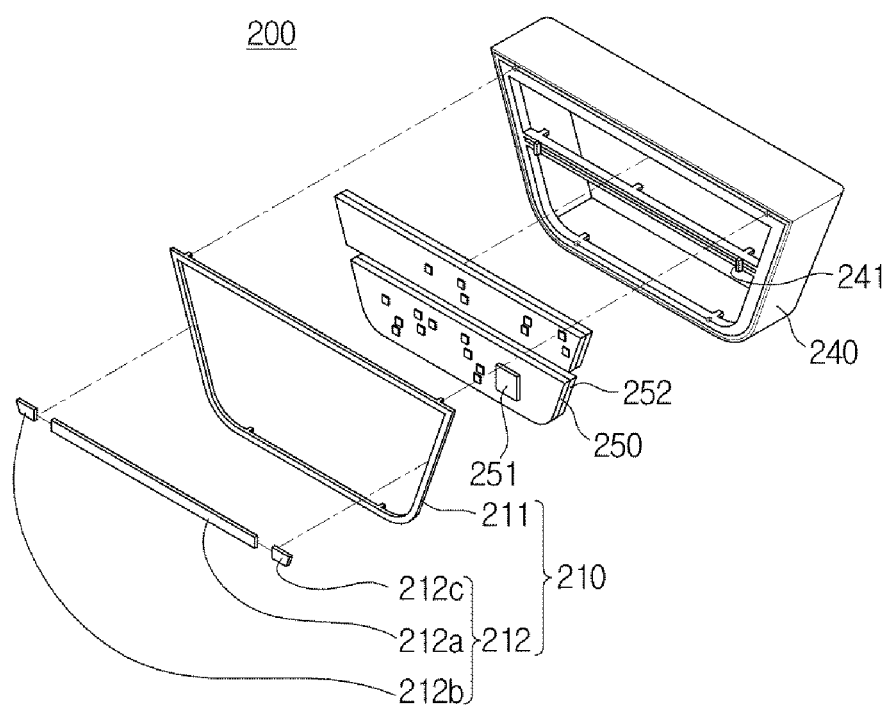
FIG. 17 is an additional exploded view of a proximity sensor, according to embodiments of the present disclosure.

FIG. 17 is an additional exploded view of a proximity sensor, according to embodiments of the present disclosure.

As shown in FIG. 17, the inner frame 212 may include a first inner frame 212a, a second inner frame 212b, and a third inner frame 212c, which are separated from one another.

The first metal layer 220 may be formed on the outer surface of each of the first, second, and third inner frames 212a, 212b, 212c.

The first metal layer formed on the first inner frame 212a may be electrically connected to the sensor electrode 230, and accordingly, to the sensor IC 251. This enables the first metal layer formed on the first inner frame 212a to serve as a sensing part.

The first metal layers formed on the second and third inner frames 212b and 212c may not be electrically connected to the sensor electrode 230, thereby not serving as sensing parts. In other words, even if the first metal layers formed on the second and third inner frames 212b and 212c are touched, the proximity sensor 200 may not recognize them.

With this structure, even if the user's body parts contact the second inner frame 212b or the third inner frame 212c, it may not be recognized.

In a case that the driver or the passenger sits in the seat, the user's body parts, such as knees may come into contact with the proximity sensor according to the position of the proximity sensor and the user's habit. For example, the right knee of the driver may contact the left end of the inner frame 212 and the passenger's left knee may contact the right end of the inner frame 212. Such contacts are not intended to touch or push a button but correspond to noise, so the proximity sensor should not recognize them.

As shown in FIG. 17, with the structure in which the inner frame 212 is parted into three parts and physically separated, if the second inner frame 212b or the third inner frame 212c is touched, the proximity sensor 200 may not recognize it. That is, it may get rid of noise.

On the other hand, with a structure simply having gaps between the first and second inner frames 212a and 212b and between the first and third inner frames 212a and 212c, the first inner frame 212a may happen to contact the second inner frame 212b or the third inner frame 212c. At this time, the first metal layers come into contact with each other, and thus the second inner frame 212b and the third inner frame 212 may serve as sensing parts. In this case, the noise such as recognition of knee touch may not be eliminated. Accordingly, it is preferable to arrange ribs 241 between the first and second inner frames 212a and 212b and between the first and third inner frames 212a and 212c. The ribs 241 may be integrated into the panel 240 without being limited thereto.

According to embodiments of the present disclosure, a proximity sensor as described herein may have the metallic exterior to give improved aesthetic feeling.

According to embodiments of the present disclosure, a proximity sensor may be provided having an easily manufactured design and simple structure.

According to embodiments of the present disclosure, a proximity sensor may be provided having efficient space utilization because it requires no extra installation space.

According to embodiments of the present disclosure, a proximity sensor may be provided having improved substance selection and degree of freedom for design.

According to embodiments of the present disclosure, a proximity sensor may be provided to have reduced noise-making frequency by revising its sensing area.

Several embodiments have been described above, but a person of ordinary skill in the art will understand and appreciate that various modifications can be made without departing the scope of the present disclosure. Thus, it will be apparent to those ordinary skilled in the art that the true scope of technical protection is only defined by the following claims.

What is claimed is:

1. A proximity sensor installed inside a vehicle, the proximity sensor comprising:
   an outer frame formed of a first non-conductive substance;
   an inner frame formed of a second non-conductive substance and disposed in an interior of the outer frame, the inner frame comprising a first inner frame, a second inner frame, and a third inner frame, which are separated from one another;
   a first metal layer covering the outer frame, the second inner frame, and the third inner frame;
   a second metal layer covering the first inner frame;
   a sensor electrode contacting the second metal layer; and
   a sensor Integrated Circuit (IC) connected to the sensor electrode and configured to detect an approach or a contact of a user's hand,
   wherein the first metal layer is connected to a ground (GND) so as to confine a sensing field of the sensor electrode to the interior of the outer frame.

2. The proximity sensor of claim 1, further comprising: a printed circuit board (PCB) having the sensor IC mounted thereon and including a ground layer forming the ground (GND).

3. The proximity sensor of claim 1, further comprising: a connector connecting the first metal layer to the ground (GND).

4. The proximity sensor of claim 3, wherein the outer frame comprises a metal complex, and the connector is formed by metalizing an electrode recess formed by irradiating laser to the outer frame.

5. The proximity sensor of claim 3, wherein the connector comprises at least one of a wire, a flexible PCB, and a conductive tool.

6. The proximity sensor of claim 1, wherein the outer frame includes a closed loop forming a range of a sensing field of the sensor electrode.

7. The proximity sensor of claim 6, wherein the inner frame is formed to divide the closed loop of the outer frame into at least two portions.

8. The proximity sensor of claim 1, further comprising: non-conductive ribs disposed between the first and second inner frames and between the first and third inner frames.

9. The proximity sensor of claim 1, wherein the inner frame comprises a metal complex, and the sensor electrode is formed by metalizing an electrode recess formed by irradiating laser to the inner frame.

* * * * *